United States Patent
Hush et al.

(10) Patent No.: US 10,832,745 B1
(45) Date of Patent: Nov. 10, 2020

(54) APPARATUSES AND METHODS FOR PERFORMING OPERATIONS USING SENSE AMPLIFIERS AND INTERMEDIARY CIRCUITRY

(71) Applicant: Micron Technology, Inc., Boise, ID (US)

(72) Inventors: Glen E. Hush, Boise, ID (US); Honglin Sun, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/523,583

(22) Filed: Jul. 26, 2019

(51) Int. Cl.
| | |
|---|---|
| *G11C 7/02* | (2006.01) |
| *G11C 7/06* | (2006.01) |
| *G06N 3/063* | (2006.01) |
| *G11C 11/4091* | (2006.01) |
| *G11C 7/08* | (2006.01) |
| *G11C 13/00* | (2006.01) |

(52) U.S. Cl.
CPC ............ *G11C 7/065* (2013.01); *G06N 3/063* (2013.01); *G11C 7/062* (2013.01); *G11C 7/08* (2013.01); *G11C 11/4091* (2013.01); *G11C 2013/0054* (2013.01)

(58) Field of Classification Search
CPC ....... G11C 7/065; G11C 7/08; G11C 11/4091; G11C 7/062; G11C 2013/0054; G06N 3/063
See application file for complete search history.

(56) References Cited

U.S. PATENT DOCUMENTS

| | | | |
|---|---|---|---|
| 5,050,095 A | 9/1991 | Samad | |
| 7,043,466 B2 | 5/2006 | Watanabe et al. | |
| 9,099,190 B2* | 8/2015 | Torti | G11C 7/067 |
| 9,224,501 B2 | 12/2015 | Kong | |
| 10,134,469 B1* | 11/2018 | Liu | G11C 13/0033 |
| 2004/0073764 A1 | 4/2004 | Andreasson | |
| 2012/0250424 A1 | 10/2012 | Yoshihara et al. | |
| 2015/0085586 A1 | 3/2015 | Zheng et al. | |
| 2016/0284390 A1* | 9/2016 | Tomishima | G11C 7/20 |

(Continued)

FOREIGN PATENT DOCUMENTS

KR    10-2014-0112253 A    9/2014

OTHER PUBLICATIONS

International Search Report and Written Opinion from related International Application No. PCT/US2020/036304, dated Sep. 15, 2020, 10 pages.

*Primary Examiner* — Gene N Auduong
(74) *Attorney, Agent, or Firm* — Brooks, Cameron & Huebsch, PLLC

(57) ABSTRACT

Systems, apparatuses, and methods related to performing operations within a memory device are described. Such operations may be performed using data latched in multiple sense amplifiers that are distributed among a plurality of sense amplifiers of the memory device. For example, those sense amplifiers, among the plurality of sense amplifiers, storing data associated with the operation(s) can be determined, and the data can be selectively sent from the determined sense amplifiers to an operation unit, in which the operations are performed. The operations may be made without affecting a subsequent read command that requests data from the plurality of sense amplifiers.

17 Claims, 6 Drawing Sheets

(56) References Cited

U.S. PATENT DOCUMENTS

| | | |
|---|---|---|
| 2017/0102945 A1 | 4/2017 | Henry et al. |
| 2018/0005697 A1 | 1/2018 | Park et al. |
| 2018/0232629 A1 | 8/2018 | Du et al. |
| 2019/0108094 A1 | 4/2019 | Lea et al. |

\* cited by examiner

US 10,832,745 B1

APPARATUSES AND METHODS FOR PERFORMING OPERATIONS USING SENSE AMPLIFIERS AND INTERMEDIARY CIRCUITRY

TECHNICAL FIELD

The present disclosure relates generally to memory, and more particularly to apparatuses and methods associated with performing operations using sense amplifiers and intermediary circuitry.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block (referred to herein as functional unit circuitry (FUC)), for example, which can be used to execute instructions by performing logical operations such as AND, OR, NOT, NAND, NOR, and XOR logical operations on data (e.g., one or more operands). For example, the FUC may be used to perform arithmetic operations such as addition, subtraction, multiplication, and/or division on operands.

DETAILED DESCRIPTION

Figure 1:
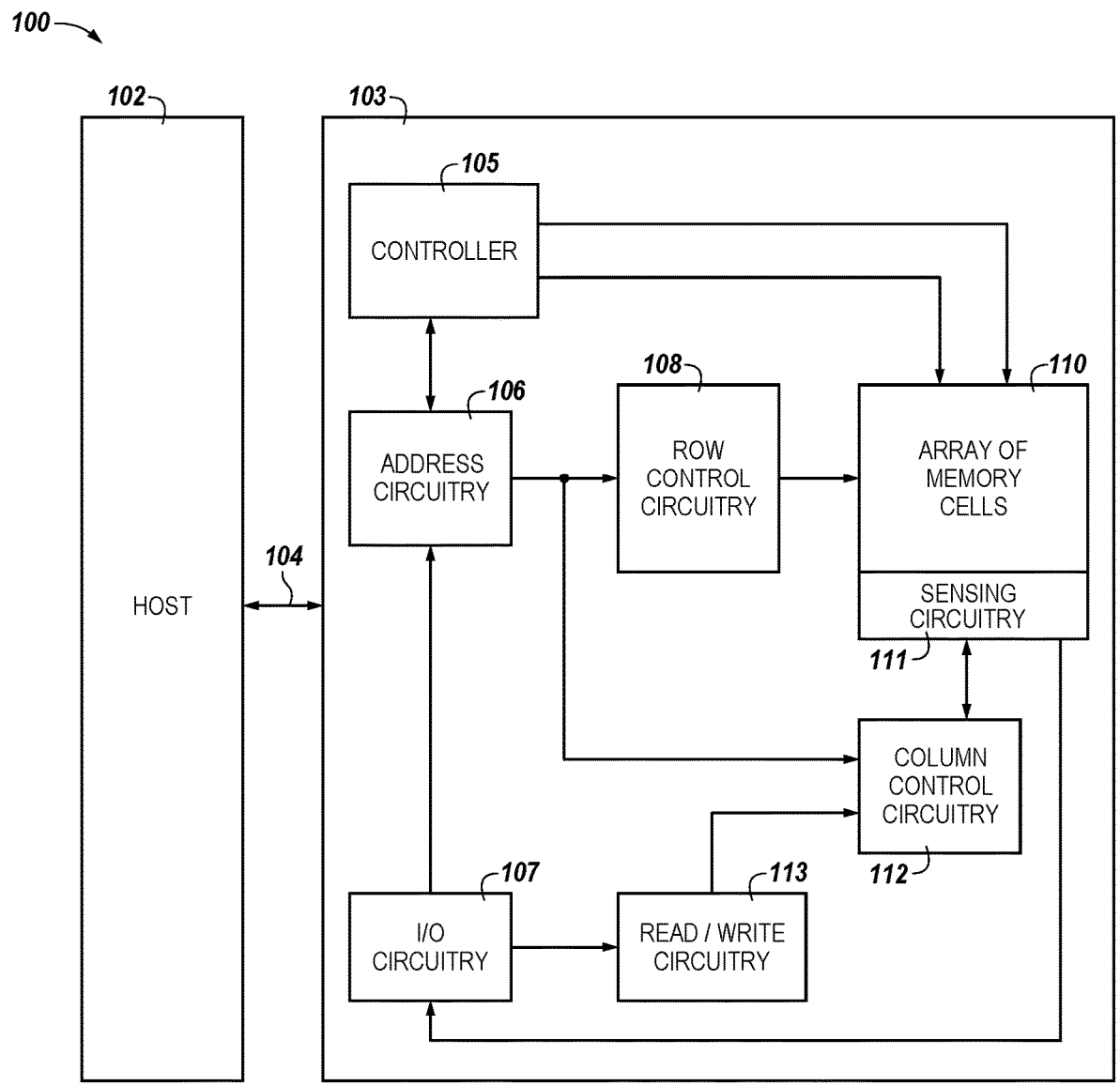
FIG. 1 is a block diagram of an apparatus in the form of a computing system including a memory device in accordance with a number of embodiments of the present disclosure.

The present disclosure includes apparatuses and methods related to performing operations using sense amplifiers and intermediary circuitry. An apparatus may include column control circuitry coupled to a plurality of sense amplifiers storing respective data latched from an array of memory cells and intermediary circuitry coupled to the plurality of sense amplifiers. The column control circuitry is configured to control the plurality of sense amplifiers and the intermediary circuitry to receive signaling that indicates a request for an operation on data stored in at least one of the plurality of sense amplifiers, determine a portion of the plurality of sense amplifiers storing the data, and send the data stored in the portion to the intermediary circuitry.

A number of components in a computing system may be involved in performing various operations using processing resources such as a controller and/or host processor. In many instances, the processing resources may be external to an array of memory cells storing data (e.g., operands with which the operations will be performed), and the data may be read (e.g., accessed) from the array to the processing resources in an order that the data is stored in the array. Accordingly, data read from the array in this manner may need to be further manipulated (e.g., reordered and/or reorganized) at the processing resources, which may reduce a throughput associated with performing the operations at the processing resources. The reduced throughput associated with the processing resources may reduce an overall performance of the computing system.

A number of embodiments of the present disclosure include additional intermediary circuitry local to the array of memory cells and performing various operations using the intermediary circuitry. Having the intermediary circuitry can eliminates a need to use the processing resources for further manipulating the data and/or performing the operations, which can provide various benefits such as an improved overall performance of a computing system. Further, using the intermediary circuitry to perform the operations may reduce the number of steps typically carried out by the processing resources.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices.

The figures herein follow a numbering convention in which the first digit or digits of a reference number correspond to the figure number and the remaining digits identify an element or component in the figure. Similar elements or components between different figures may be identified by the use of similar digits. For example, 103 may reference element "03" in FIG. 1, and a similar element may be referenced as 203 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory The system 100 can include separate integrated circuits, or both the host 102 and the memory device 103 can be on the same integrated circuit. For example, the host 102 may be a system controller of a memory system comprising multiple memory devices 103, with the system controller 102 providing access to the respective memory devices 103 by another processing resource such as a central processing unit (CPU).

The memory device 103 includes address circuitry 106 to latch address signals provided over the interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z, cache coherent interconnect for accelerators (CCIX), or the like. Address signals are received and decoded by a row control circuitry 108 and column control circuitry 112 to access the memory array 110.

The I/O circuitry 107 can be used for bi-directional data communication with the host 102 over the interface 104. The read/write circuitry 113 is used to write data to the memory array 110 or read data from the memory array 110. As an example, the read/write circuitry 113 can comprise various drivers, latch circuitry, etc.

The memory device 103 can include a controller 105. The controller 105 can decode signals, such as commands, provided from the host 102. These signals can include chip enable signals, write enable signals, and address latch signals that are used to control operations performed on the memory array 110, including data read operations, data write operations, and data erase operations. The controller 105 can comprise a state machine, a sequencer, and/or some other type of controller, which may be implemented in the form of hardware, firmware, or software, or any combination of the three. In some examples, the host 102 can be a controller external to the memory device 103. For example, the host 102 can be a memory controller which is coupled to a processing resource of a computing device.

For clarity, the system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although a single array 110 is shown in FIG. 1, embodiments are not so limited. For instance, memory device 103 may include a number of arrays 110 (e.g., a number of banks of DRAM cells).

Data can be read from memory array 110 by sensing voltage and/or current changes on the sense lines using sensing circuitry 111. The sensing circuitry 111 can comprise, for example, sense amplifiers, intermediary circuitry, and/or buffers (e.g., output buffers), as further described in connection with FIGS. 2 and 3B. The sense amplifiers can read and latch a page (e.g., row) of data from the memory array 110, the intermediary circuitry can perform various operations on (e.g., using) data latched in the sense amplifiers, and the buffers can store the data received from the sense amplifiers and/or results of the operations performed using the intermediary circuitry.

In a number of embodiments, the column control circuitry 112 can be configured to control, to perform various operations (e.g., down-sampling operations such as pooling operations), a data path among sense amplifiers, various components of the intermediary circuitry, and/or buffers. As an example, the column control circuitry 112 can firstly determine a type of an operation/request to be performed on data (e.g., data values) latched in the sense amplifiers (e.g., from the array of memory cells 110), and send the data values to the intermediary circuitry and/or directly to the buffers based on the determined type of the operation/request. Performing the operation using the intermediary circuitry may reduce a number of steps typically carried out in performing the operation. Further details of performing operations by controlling data paths among sense amplifiers, various components of intermediary circuitry, and/or buffers are described in connection with FIGS. 3A-3B.

Figure 2:
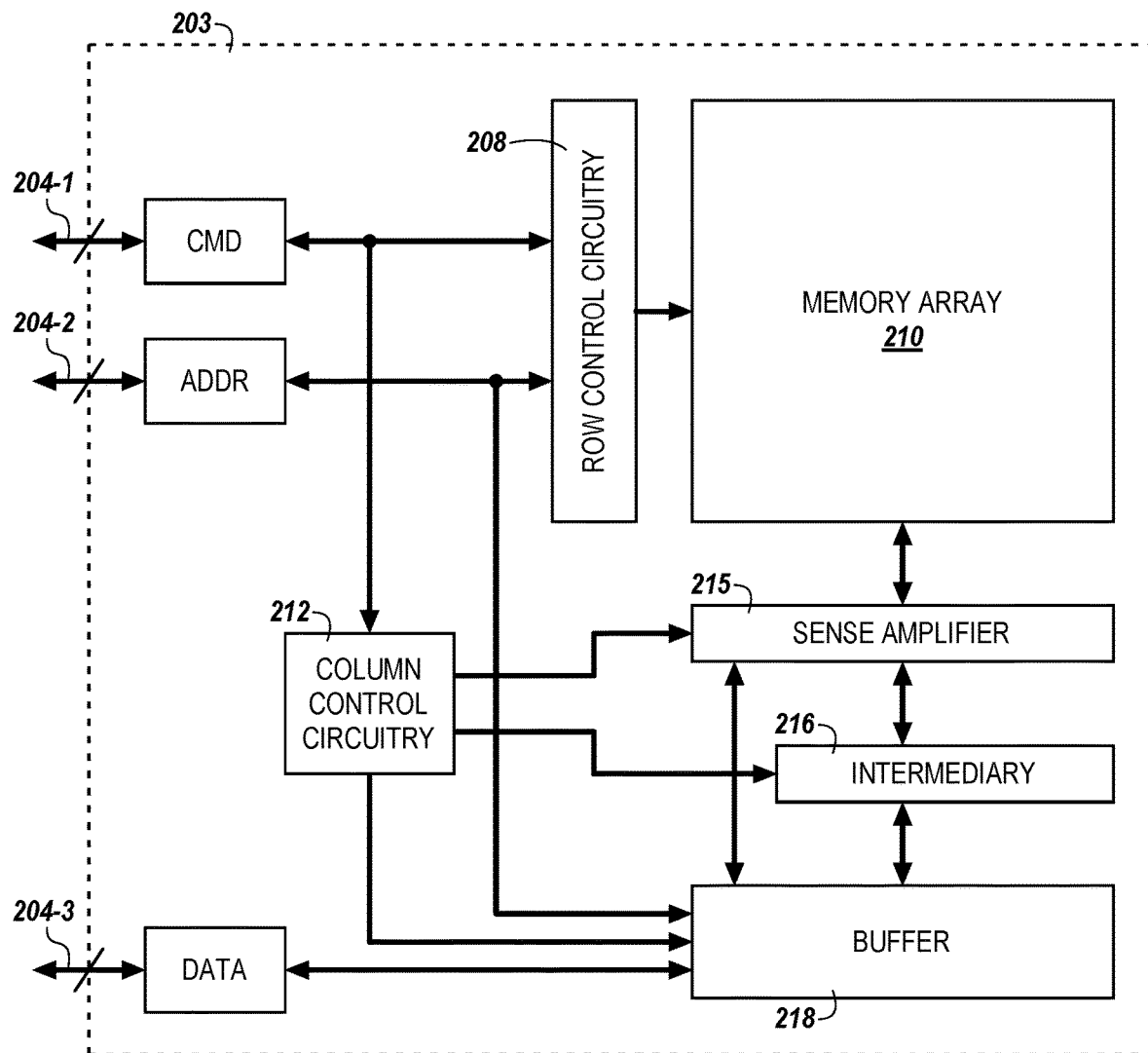
FIG. 2 is a block diagram of an apparatus in the form of a memory device in accordance with a number of embodiments of the present disclosure.

FIG. 2 is a block diagram of an apparatus in the form of a memory device 203 in accordance with a number of embodiments of the present disclosure. The memory device 203 is analogous to the memory device 103 in FIG. 1. The memory device 203 also comprises a row control 208, a memory array 210, a sense amplifier 215, intermediary circuitry 216, buffers 218, and column control circuitry 212. In some embodiments, the memory device 203 can be a three-dimensional (3D) memory device having multiple layers stacked together. As an example, one of the layers (e.g., of the memory device 203) can include an array of memory cells (e.g., array of memory cells 210), while another one of the layers (e.g., complimentary metal-oxide-semiconductor (CMOS) under an array of memory cells) can include other circuitries, such as the intermediary circuitry 216.

The memory device 203 can receive and/or provide data through the interfaces 204-1, 204-2, and 204-3. The interface 204-1 can be a command bus, the interface 204-2 can be an address bus, and the interface 204-3 can be a data bus. The interface 204-1 can be used for bidirectional communications of commands. The interface 204-2 can be used for bidirectional communications of addresses. The interface 204-3 can be used for bidirectional communication of data stored in the memory array 210.

In a number of embodiments, the memory device 203 can receive signaling/commands through the interface 204-1 that causes the column control circuitry 212 to perform various operations on data latched in the sense amplifiers 215. As an example, the signaling received via the interface 204-1 can indicate a request for operations on the data latched in the sense amplifiers such as down-sampling operations such as pooling operations. In another example, the command received via the interface 204-1 can be a read command for data latched in the sense amplifiers 215.

The sense amplifiers 215 can sense and/or store data from the memory array 210. The data can include data bits (e.g., a plurality of sets of data bits stored in respective sense amplifiers), which can represent respective data values. For example, a group of multiple data bits stored in sense amplifiers, such as 8 data bits of "00001010", can represent a numerical base ten (10) data value, such as "10."

The intermediary circuitry 216 can include a number of operation units that can be utilized to perform various operations. As used herein, an operation unit refers to particular circuitry and/or a combination of various circuitries collectively configured to perform a particular operation, such as a down-sampling (e.g., non-linear down-sampling) operation. Example circuitry an operation unit can include is a comparator (e.g., which can collectively form a comparator tree), limiter, clamper, detector (e.g., peak detector), clipper, rectifier, summing amplifier, error amplifier, differentiator, lead/lag circuitry, and/or sample and hold circuitry. As used herein, a down-sampling operation refers to a process of resampling in a multi-rate digital signal processing system. An example down-sampling operation can be a pooling operation, which takes, for example, an image as an input, partitions the image into a set of non-overlapping rectangles, and, outputs, for each such sub-region having a plurality of data values, a particular data value that satisfies a particular condition. For example, a MAX (e.g., extremum value such as maximum) pooling operation performed on a particular sub-region outputs a data value, among data values of the particular sub-region, having a greater value than other data values. For example, a MEAN (e.g., average) pooling operation performed on a particular sub-region outputs an average value of data values of the particular sub-region. For example, a MIN (e.g., extremum value such as minimum) pooling operation performed on a particular sub-region outputs a data value, among data values of the particular sub-region, having a less value than other data values. These types of operations can be performed as a part of executing various machine learning algorithms (e.g., computer vision and/or image recognition, among others) and using various types of operation units, such as comparators, which can output feedback signals based on comparisons among values (e.g., data values).

The buffers 218 can be coupled to the sense amplifiers 215 directly and/or indirectly via intermediary circuitry 216. The size of the buffers 218 can correspond to the size of the sense amplifiers 215 and/or (e.g., operation units of) the intermediary circuitry 216. For example, the buffer 218 can store a quantity of data equal to the quantity of data latched from sense amplifiers 215 and/or operation units of the intermediary circuitry 216. The buffer 218 can store data utilizing registers, cells, and/or different types of charge storage devices.

The column control circuitry 212 can be configured to control data paths among sense amplifiers 215, intermediary circuitry 216, and/or buffers 218. In at least one embodiment, to perform a memory operation such as a read operation, the column control circuitry 212 can be configured to determine those sense amplifiers (e.g., sense amplifiers 215) storing data values that have been read (or those sense amplifiers coupled to memory cells storing data values to be read during a read operation), and send data values from the sense amplifiers firstly to a buffer (e.g., buffers 218) and to a host (e.g., host 102).

In another embodiment, for those operations to be performed using the intermediary circuitry, the column control circuitry 212 can be configured to determine those sense amplifiers (e.g., sense amplifiers 215) storing data values to be used to perform a particular operation, and send the data values stored in the sense amplifiers to the intermediary circuitry, in which the particular operation is performed. Subsequently, a result of the operation performed at the intermediary circuitry 216 can be sent, by the column control circuitry 212, to one of the buffers 216. Further details of performing operations (e.g., pooling operations) by controlling data paths among sense amplifiers 215, intermediary circuitry 216, and/or buffers 218 are described in connection with FIGS. 3A-3B.

Figure 3A:
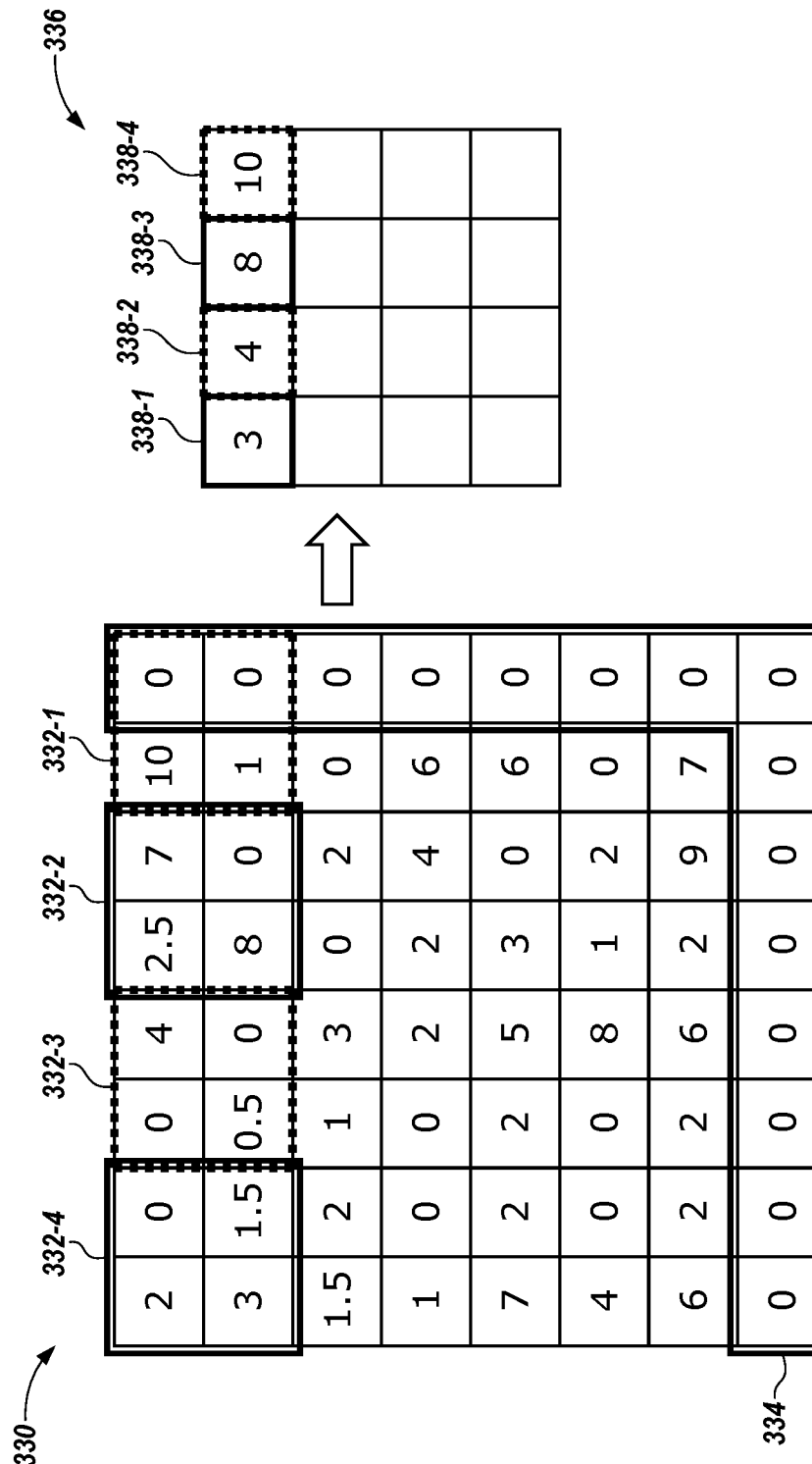
FIG. 3A illustrates an example logical view of data values associated with performing a pooling operation in accordance with a number of embodiments of the present disclosure.

FIG. 3A illustrates an example logical view of data values 330 associated with performing pooling operations in accordance with a number of embodiments of the present disclosure. A collection of the data values 330 may represent a digital image and each rectangle (e.g., a rectangle having a data value of "10") may be representative of a single pixel represented by a respective a data value. An example pooling operation illustrated in FIG. 3A is a MAX pooling operation.

As illustrated in FIG. 3A, a padding such as data values 334 can be stored in a portion of memory cells. For example, data values 334 representing a padding stored in memory cells have a value of "0." As used herein, a "padding" refers to bits stored in memory cells that do not represent data values.

In association with FIG. 3A, there are four pooling operation performed on data values 330. As an example, a first pooling operation is performed on data values 332-1 (e.g., data values "10", "0", "1", "0"); a second pooling operation is performed on data values 332-2 (e.g., data values "2.5", "7", "8", "0"); a third pooling operation is performed on data values 332-3 (e.g., data values "0", "4", "0.5", "0"); and a fourth pooling operation is performed on data values 332-4 (e.g., data values "2", "0", "3", "1.5").

Although embodiments are not so limited, each set of data values included in respective rectangles such as 332-1, 332-2, 332-3, and 332-4 can correspond to a row of an array of memory cells (e.g., array 110 and/or 210 as described in connection with FIGS. 1 and 2, respectively). For example, data values "2", "0", "3", and "1.5" of the data values 332-4 may be stored in the same row of the array of memory cells. Accordingly, a row of the array can be read when reading (e.g., latching) a corresponding set of data values from the array of memory cells to a group of sense amplifiers (e.g., groups of sense amplifiers 315 as further described in connection with FIG. 3B), and how the data values are structured in the array or in the image (e.g., 330) may be known to a user and/or host (e.g., host 102).

In some embodiments, each pooling operation (e.g., pooling operations using a respective set of data values 332-1, 332-2, 332-3, and 332-4) can be performed independently from others such that the pooling operations can be performed concurrently. Example circuitry for concurrently performing multiple pooling operations are further described in connection with FIG. 3B.

Data values 336 illustrate respective results of the pooling operations performed on data values 332-1, 332-2, 332-3, and 334-4. As an example, a data value 338-4 represent a result of the pooling operation performed on data values 332-1 (e.g., data value "10" is greater than data values "1", "0", or "0"); a data values 338-3 represent a result of the pooling operation performed on data values 332-2 (e.g., data value "8" is greater than data values "2.5", "7", or "0"); a data values 338-2 represent a result of the pooling operation performed on data values 332-3 (e.g., data value "4" is greater than data values "0", "0.5", or "0"); and a data value 338-1 represent a result of the pooling operation performed on data values 332-4 (e.g., data value "3" is greater than data values "2", "0", or "1.5").

Figure 3B:
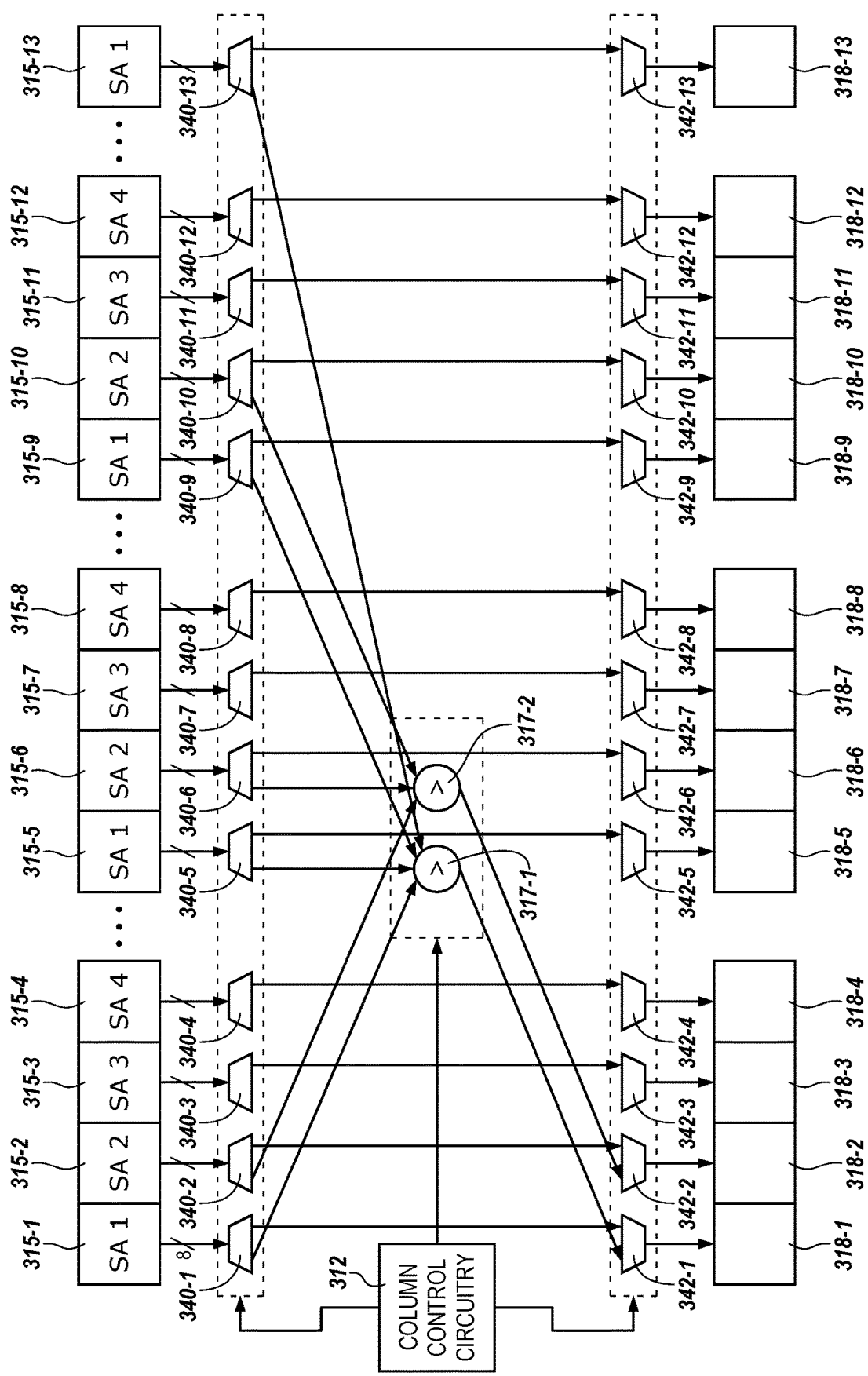
FIG. 3B is a schematic diagram of operating a number of sense amplifiers, operation units, and buffers for performing operations in accordance with a number of embodiments of the present disclosure.

FIG. 3B is a schematic diagram of operating a number of sense amplifiers 315, operation units (e.g., comparator trees 317), and buffers 318 for performing operations in accordance with a number of embodiments of the present disclosure. As illustrated in FIG. 3B, column control circuitry 312 is coupled to (e.g., multiplexers 340 of) the sense amplifiers 315, comparator trees 317, and (e.g., multiplexers 342 of) the buffers 318, and is configured to control data paths among those. The column control circuitry 312, sense amplifiers 315 and buffers 318 are analogous to column control circuitry 212, sense amplifiers 215, and buffers 218, respectively, as described in connection with FIG. 2.

Each box labeled as "SA" represents a group of sense amplifiers storing data bits corresponding to a data value. For example, when a data value includes 8 bits, a group of sense amplifiers configured to store the data value can include 8 different sense amplifiers.

Each group of sense amplifier 315 includes (e.g., is coupled to) a respective multiplexer 340 via a number of data lines (e.g., 8 data lines as illustrated in FIG. 3B). As an example, groups of sense amplifiers 315-1, 315-2, 315-3, 315-4, 315-5, 315-6, 315-7, 315-8, 315-9, 315-10, 315-11, 315-12, and 315-13 are coupled to multiplexers 340-1, 340-2, 340-3, 340-4, 340-5, 340-6, 340-7, 340-8, 340-9, 340-10, 340-11, 340-12, and 340-13, respectively. Data provided to the multiplexers can be further sent to respective operation units (e.g., comparator trees 317) and/or multiplexers 342 coupled to respective buffers 318.

The column control circuitry 312 can be configured to control data paths between multiplexers 340 and respective operation units such as comparator trees 317 (and/or buffers 318) to perform operations such as pooling operations described in connection with FIG. 3A. As an example, the column control circuitry 312 can determine that those groups of sense amplifiers 315-1, 315-5, 315-9, and 315-13 (e.g., "SA1") store data values (e.g., data values 332-1 illustrated in FIG. 3A) to be used for the same in-memory operation such as the same pooling operation. Accordingly, the column control circuitry 312 can be configured to send the data values stored in the groups of sense amplifiers 315-1, 315-5, 315-9, and 315-13 to a comparator tree 317-1. Similarly, the column control circuitry 312 can determine that at least those groups of sense amplifiers 315-2, 315-6, and 315-10 (e.g., "SA2" along with additional sense amplifiers that are not illustrated in FIG. 3B) store data values (e.g., data values 332-2 illustrated in FIG. 3A) to be used for the same pooling operation, and send the data values stored in the groups of sense amplifiers 315-2 to a comparator tree 317-2.

In some embodiments, the column control circuitry 312 can be configured to put a power state of those sense amplifiers (e.g., sense amplifiers 315) that are not in use into a reduced power state (e.g., power-off state). As an example, groups of sense amplifiers 340-3, 340-4, 340-7, 340-8, 340-11, and/or 340-12 (e.g., "SA 3" and/or "SA 4") may be put into a reduced power state at least while the pooling operations are being performed at the comparator trees 317-1 and 317-2 with data values sent from the groups of sense amplifiers 315-1, 315-2, 315-5, 315-6, 315-9, 315-10, and 315-13 (e.g., "SA 1" and "SA 2"). As another example, those sense amplifiers not being used to read memory cells or store data as part of a requested operation can be put into a reduced power state and only those sense amplifiers being used to read memory cells or store data as part of the requested operation can be fully powered.

Each comparator tree 317-1 and 317-2 is configured to perform respective pooling operations (e.g., MAX pooling) using data values 332-1 and 332-2 illustrated in FIG. 3A, respectively. Although not illustrated in FIG. 3B, intermediary circuitry can include a greater quantity of operation units (e.g., comparator trees such as comparator trees 317-1 and/or 317-2) to perform a greater quantity of operations concurrently. As an example, pooling operations using data values 332-3 and/or 332-4 illustrated in FIG. 3A can be performed concurrently with pooling operations using data values 332-1 and 332-2 illustrated in FIG. 3A by having more comparator trees. Alternatively, pooling operations using data values 332-3 and/or 332-4 illustrated in FIG. 3A can be performed when comparator trees 317-1 and/or 317-2 become available (e.g., subsequent to performing pooling operations using data values 332-1 and/or 332-2 illustrated in FIG. 3A).

The column control circuitry 312 can be configured to send a result obtained from respective comparator trees 317-1 and 317-2 to respective buffers 318. As an example, a result obtained from the comparator tree 317-1 can be sent to and stored in the buffer 318-1, while a result obtained from the comparator tree 317-2 can be sent to and stored in the buffer 318-2. In some embodiments, results obtained from comparator trees can be repetitively stored in remaining buffers such as buffers 318-3, 318-4, 318-5, 318-6, 318-7, 318-8, 318-9, 318-10, 318-11, 318-12, and/or 318-13.

In some embodiments, the column control circuitry 312 can be configured to send data values directly to buffers 318 from the sense amplifiers 315. As an example, in performing a read operation (e.g., that does not involve using the intermediary circuitry 316) on data values stored in the sense amplifiers 315, the column control circuitry 312 can be configured to send the data values from the multiplexers 340 to respective multiplexers 342 via respective data lines coupling the multiplexers 340 directly to the respective multiplexers 342.

Figure 4:
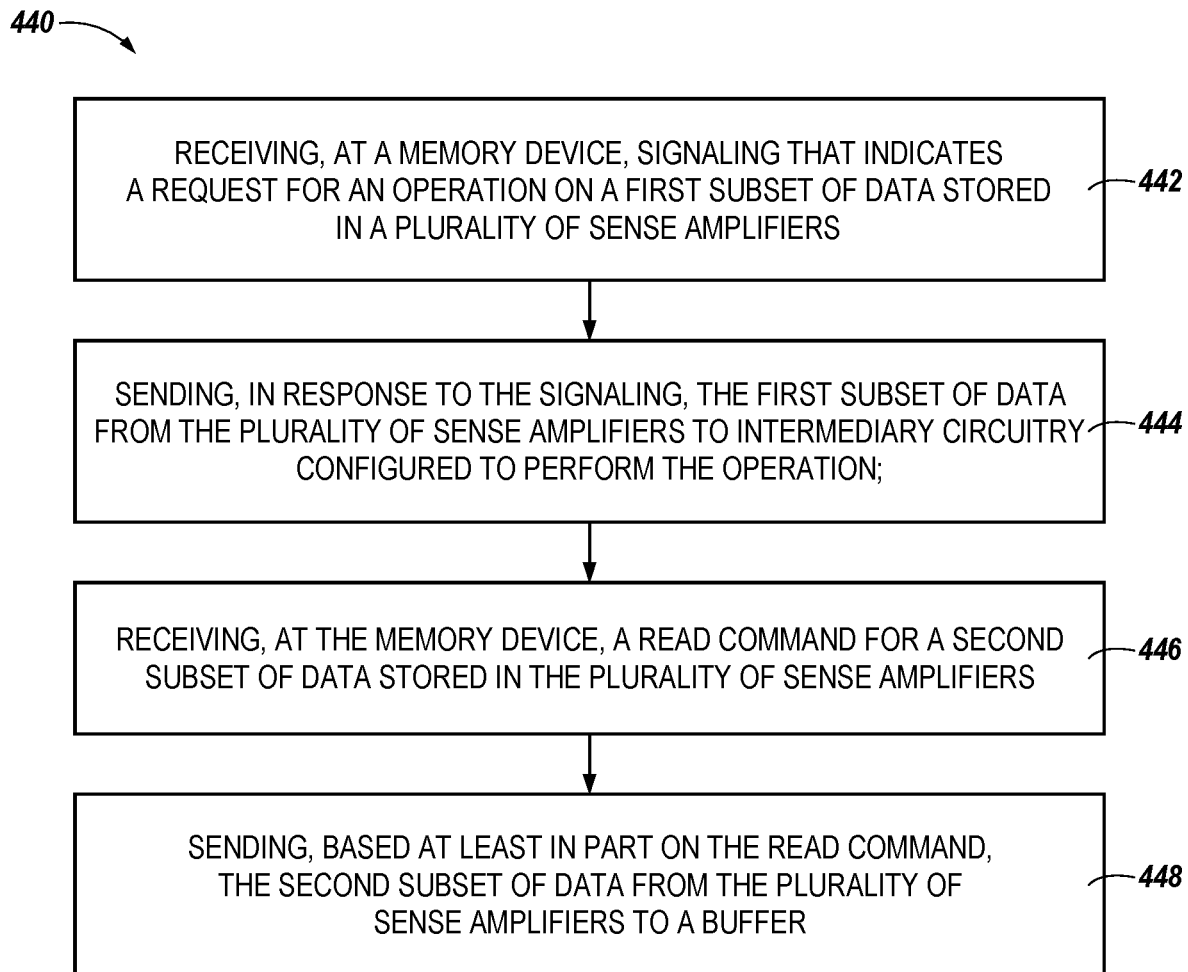
FIG. 4 illustrates an example flow diagram of a method for performing an operation using sense amplifiers and intermediary circuitry in accordance with a number of embodiments of the present disclosure.

FIG. 4 illustrates an example flow diagram of a method 440 for performing an operation using sense amplifiers and intermediary circuitry in accordance with a number of embodiments of the present disclosure. At 442, signaling that indicates a request for an operation on a first subset of data stored in a plurality of sense amplifiers are received at a memory device (e.g., memory device 103 and/or 203 described in connection with FIGS. 1 and 2, respectively).

At 444, the first subset of data are sent from the plurality of sense amplifiers to intermediary circuitry (e.g., intermediary circuitry 216 and/or 316 described in connection with FIGS. 2 and 3, respectively) in response to the signaling. At 446, a read command for a second subset of data stored in the plurality of sense amplifiers are received at the memory device. At 448, the second subset of data is sent, based at least in part on the read command, from the plurality of sense amplifiers to a buffer.

As described in FIG. 4, data values can be sent to the intermediary circuitry or directly to the buffer based on a type of an operation/request received. As an example, if a down-sampling operation (e.g., pooling operation) is requested to be performed using the intermediary circuitry, the data values can be sent from the sense amplifiers firstly to the intermediary circuitry, and a result of the operation performed at the intermediary circuitry can be subsequently sent from the intermediary circuitry to the buffer. As an example, if the received request is a read command for the data values from the plurality of sense amplifiers, the data values can be sent from the sense amplifiers directly to the buffer. In this example, the intermediary circuitry can be skipped in sending the data values from the sense amplifiers to the buffer. The intermediary circuitry and buffer can be analogous to intermediary circuitry 216 and buffers 218, as previously described in connection with FIG. 2.

In some embodiments, multiple operations/requests can be performed/executed concurrently. For example, data values from a first portion of the plurality of sense amplifiers (where the first subset of data is stored) can be sent to the intermediary circuitry concurrently while data values from a second portion of the plurality of sense amplifiers (where the second subset of data is stored) are sent directly to the buffer(s).

Figure 5:
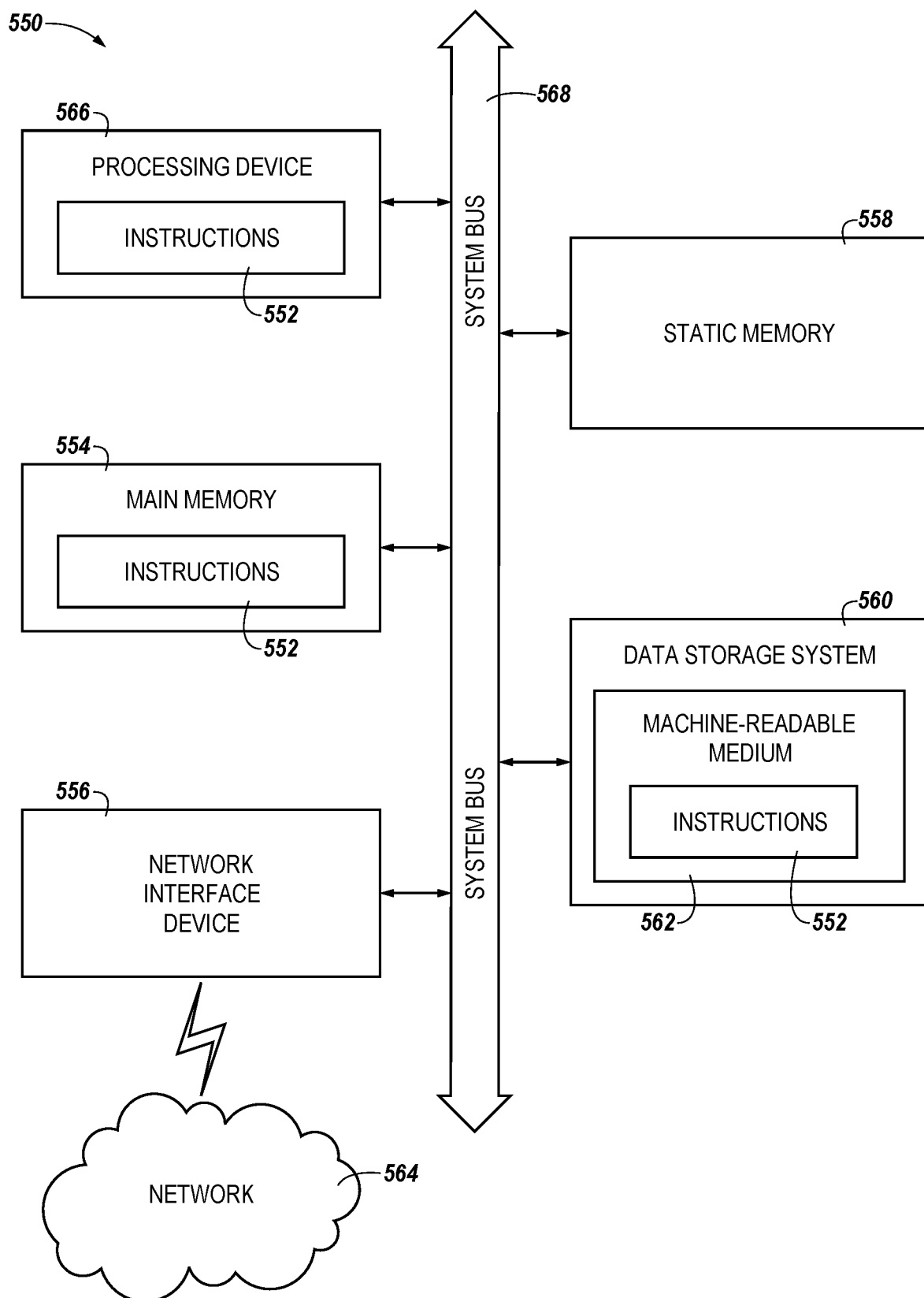
FIG. 5 illustrates an example machine of a computer system within which a set of instructions, for causing the machine to perform various methodologies discussed herein, can be executed.

FIG. 5 illustrates an example machine of a computer system 550 within which a set of instructions, for causing the machine to perform various methodologies discussed herein, can be executed. In various embodiments, the computer system 550 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 550 includes a processing device 566, a main memory 554 (e.g., read-only memory (ROM), flash memory, dynamic random access memory (DRAM) such as synchronous DRAM (SDRAM) or Rambus DRAM (RDRAM), etc.), a static memory 558 (e.g., flash memory, static random access memory (SRAM), etc.), and a data storage system 560, which communicate with each other via a bus 568.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 552 for performing the operations and steps discussed herein. The computer system 550 can further include a network interface device 556 to communicate over the network 564.

The data storage system 560 can include a machine-readable storage medium 562 (also known as a computer-readable medium) on which is stored one or more sets of instructions 552 or software embodying any one or more of the methodologies or functions described herein. The instructions 552 can also reside, completely or at least partially, within the main memory 554 and/or within the processing device 502 during execution thereof by the computer system 550, the main memory 554 and the processing device 502 also constituting machine-readable storage media.

In one embodiment, the instructions 552 include instructions to implement functionality corresponding to the host 102 and/or the memory device 103 of FIG. 1. While the machine-readable storage medium 562 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
   column control circuitry coupled to:
      a plurality of sense amplifiers storing respective data latched from an array of memory cells; and
      intermediary circuitry coupled to the plurality of sense amplifiers; and wherein the column control circuitry configured to control the plurality of sense amplifiers and the intermediary circuitry to:
receive signaling that indicates a request to perform a number of compare operations;
determine a portion of the plurality of sense amplifiers that stores data on which the number of compare operations is requested to be performed, wherein the data corresponds to a number of data values respectively stored in the portion of the plurality of sense amplifiers; and
send the data stored in the portion of the plurality of sense amplifiers to the intermediary circuitry to cause the intermediary circuitry to:
perform the number of compare operations using the data received from the portion of the plurality of sense amplifiers; and
output one of the number of data values having a greater value than other data values of the number of data values.

2. The apparatus of claim 1, wherein the column control circuitry is configured to control the intermediary circuitry to perform the number of compare operations using the data received from the portion of the plurality of sense amplifiers.

3. The apparatus of claim 2, further comprising:
a buffer coupled to the intermediary circuitry and the plurality of sense amplifiers; and
wherein the column control circuitry is configured to send a result of the number of compare operations from the intermediary circuitry to a buffer coupled to the intermediary circuitry.

4. The apparatus of claim 3, wherein the column control circuitry is further configured to:
receive a read command for data stored in another portion of the plurality of sense amplifiers; and
send, based at least part on the read command, a number of data values from the another portion of the plurality of sense amplifiers directly to the buffer.

5. The apparatus of claim 3, wherein the column control circuitry is configured to send the result of the number of compare operations from the buffer to a host.

6. The apparatus of claim 1, wherein the intermediary circuitry comprises a comparator tree configured to perform the number of compare operations among the respective data values.

7. The apparatus of claim 1, wherein the column control circuitry is configured to cause the intermediary circuitry to perform a number of different compare operation to output a particular one of the data values having a lesser value than others.

8. The apparatus of claim 1, wherein the column control circuitry is configured to cause the intermediary circuitry to perform a number of different compare operation to output an average value of the data values.

9. An apparatus, comprising:
a plurality of sense amplifiers;
intermediary circuitry comprising a plurality of operation units each coupled to the plurality of sense amplifiers, wherein at least one of the plurality of operation units is configured to perform a pooling operation on data values stored in at least a portion of the plurality of sense amplifiers; and
column control circuitry coupled to the plurality of sense amplifiers and the intermediary circuitry, wherein the column control circuitry is configured to:
receive signaling that indicates requests for a first operation and a second operation;
determine which portions of the plurality of sense amplifiers store respective data values to be used in performing the first operation and the second operation;
send, in response to a determination that a first portion of the plurality of sense amplifiers stores data values associated with the first operation, the data values of the first portion to a first one of the plurality of operation units; and
send, in response to a determination that a second portion of the plurality of sense amplifiers stores data values associated with the second operation, the data values of the second portion to a second one of the plurality of operation units.

10. The apparatus of claim 9, wherein at least one of the plurality of operation units comprises a comparator tree.

11. The apparatus of claim 9, wherein the column control circuitry is configured to perform the first operation and the second operation concurrently.

12. The apparatus of claim 9, further comprising a plurality of buffers configured to store respective results of the first operation and the second operation, and wherein the column control circuitry is configured to:
send a result of the first operation from the first one of the plurality of operation units to one of the plurality of buffers; and
send a result of the second operation from the second one of the plurality of operation units to another one of the plurality of buffers.

13. A method, comprising:
receiving, at a memory device, signaling that indicates a request for an operation on a first subset of data stored in a plurality of sense amplifiers;
sending, in response to the signaling, the first subset of data from the plurality of sense amplifiers to intermediary circuitry configured to perform the operation;
receiving, at the memory device, a read command for a second subset of data stored in the plurality of sense amplifiers; and
sending, based at least in part on the read command, the second subset of data from the plurality of sense amplifiers directly to a buffer by skipping the intermediary circuitry.

14. The method of claim 13, wherein the requested operation comprises a down-sampling operation.

15. The method of claim 13, wherein:
sending, in response to the signaling, the first subset of data to the intermediary circuitry comprises sending the first subset of data to the intermediary circuitry from a first portion of the plurality of sense amplifiers;
sending, based at least in part on the read command, the second subset of data to the buffer comprises sending the data to the buffer from a second portion of the plurality of sense amplifiers;
wherein the method further comprises sending the data values from the first portion of the plurality of sense amplifiers concurrently with the data values from the second portion of the plurality of sense amplifiers.

16. The method of claim 13, wherein sending the data values to the intermediary circuitry further comprises:
performing, using the intermediary circuitry, the requested operation using the first subset of data sent to the intermediary circuitry; and
sending a result of the requested operation to the buffers.

17. The method of claim 16, wherein:
the first subset of data sent to the intermediary circuitry comprises a plurality of data values; and performing, using the intermediary circuitry, the requested operation using the first subset of data to the intermediary circuitry comprises outputting a particular one of the plurality of data values having a greater value than others of the data values.

\* \* \* \* \*